(12) United States Patent
Park et al.

(10) Patent No.: US 6,486,506 B1
(45) Date of Patent: Nov. 26, 2002

(54) FLASH MEMORY WITH LESS SUSCEPTIBILITY TO CHARGE GAIN AND CHARGE LOSS

(75) Inventors: Stephen Keetai Park, Austin, TX (US); Jeffrey A. Shields, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/532,293

(22) Filed: Mar. 23, 2000

Related U.S. Application Data

(60) Provisional application No. 60/162,818, filed on Nov. 1, 1999.

(51) Int. Cl.⁷ ............................................. H01L 29/72
(52) U.S. Cl. .................. 257/314; 257/382; 257/413; 257/637
(58) Field of Search ............................. 257/314, 637, 257/382, 413

(56) References Cited

U.S. PATENT DOCUMENTS

| 5,902,132 A | | 5/1999 | Mitsuhashi | 438/666 |
| 5,907,781 A | * | 5/1999 | Chen et al. | 257/314 |
| 5,913,136 A | | 6/1999 | Delconibus | 438/586 |
| 6,194,784 B1 | * | 2/2001 | Parat et al. | 257/774 |

* cited by examiner

Primary Examiner—Edward Wojciechowicz
(74) Attorney, Agent, or Firm—Foley & Lardner

(57) ABSTRACT

An integrated circuit is designed to reduce charge gain and charge loss in a flash memory or flash programmable read-only memory. Charge gain and loss caused by moisture or hydrogen diffusion or alternately small contact-to-floating gate distance is reduced by a capping layer disposed over a gate stack and a base layer of the flash memory. The capping layer includes a buffer layer, a first insulative layer, and a second insulative layer. The etch characteristics of at least the first and second insulative layer differs from an interlevel dielectric to control the dimensions of a contact extending through the interlevel dielectric and the capping layer to the base layer.

22 Claims, 3 Drawing Sheets

FLASH MEMORY WITH LESS SUSCEPTIBILITY TO CHARGE GAIN AND CHARGE LOSS

CROSS REFERENCE TO RELATED APPLICATIONS

This application claims the benefit of U.S. provisional Application Ser. No. 60/162,818 by Park et al., entitled "Flash Memory with Less Susceptibility to Charge Gain and Charge Loss" filed Nov. 1, 1999. This patent application is related to U.S. application Ser. No. 09/430,844 by Park et al., entitled "Flash Memory With Less Susceptibility To Floating Gate Charge Gain And Loss"; U.S. application Ser. No. 09/430,845 by Shields, et al., entitled "Dual Width Contact For Charge Gain Reduction"; U.S. application Ser. No. 09/430,848 by Shields, et al., entitled "Spacer Narrowed, Dual Width Contact For Charge Gain Reduction"; and U.S. Application Ser. No. 60/162,688 by Rangarajan, et al., entitled "Method of Reducing Contact Size by Spacer Filling", all of which are filed on an even date herewith and assigned to the assignee of the present invention.

FIELD OF THE INVENTION

The present invention relates to a flash memory cell and methods of manufacturing same. More particularly, the present invention relates to a flash memory cell with less susceptibility to charge gain and charge loss.

BACKGROUND OF THE INVENTION

Integrated circuits (ICs), such as ultra large scale integrated (ULSI) circuits, can presently include more than one million transistors. ICs can include various devices such as complementary metal oxide semiconductor (CMOS) field effect transistors (FETs) and flash memory cells.

A flash memory cell is generally comprised of a transistor connected to a word line and a bit line. The transistor includes a gate stack comprised of a polysilicon cap, a control gate, a control gate dielectric, a floating gate, and a tunnel dielectric. The polysilicon cap is disposed over the control gate, and the control gate is disposed over the control gate dielectric. The control gate dielectric is disposed over the floating gate, and the floating gate is disposed over the tunnel dielectric. The transistor further includes a source and a drain; the gate stack is disposed between the source and drain. The transistor still further includes an insulative spacer which abuts each side of the gate stack. The bit line connects to the drain of the transistor via a contact coupled to the drain. The word line connects to the control gate of the transistor. Voltages applied to specific parts of the flash memory cell allow storage and erasure of date (e.g., a "1" or "0") in the floating gate.

The transistor can be covered by a high temperature oxide (HTO) layer and an interlevel dielectric to insulate it from subsequently formed metal layers. An aperture or hole is etched through the interlayer dielectric and the high temperature oxide. The hole is filled with a conductive material to provide connections to the transistor, to conductors, or to other circuit structures. For example, a contact can extend from the bit line through the interlevel dielectric to the drain of the transistor. In another example, a contact or conductive via can extend through the interlevel dielectric to connect to the gate stack.

One problem associated with memory cell transistors is charge loss or charge gain. Charge loss or gain can occur from electrons traveling through the high temperature oxide or interlayer dielectric between the contact and the floating gate. Such charge gain or loss in the floating gate can destroy the data stored in the memory cell. Susceptibility to charge gain or loss increases as the distance between contacts and floating gates decreases or when gate stacks are not properly protected from moisture or hydrogen diffusion.

Distances between contacts and floating gates have become smaller as transistors disposed on integrated circuits have become smaller (e.g., transistors with gate lengths approaching 50 nanometers (nm)) so that a greater density of such transistors can be included in each integrated circuit. Moreover, high temperature oxide, as described above, is typically deposited over the gate stack as a protective layer against moisture or hydrogen diffusion. High temperature oxide, however, is not the most effective blocking layer against depletion of hydrogen or moisture from moisture or hydrogen diffusion and as such aggravates the charge gain or loss problem.

Thus, there is a need for an integrated circuit that has less susceptibility to charge gain and loss problems. Further still, there is a need for a method of manufacturing a transistor that is less susceptible to charge gain and charge loss. Even further still, there is a need for a flash memory cell that includes an apparatus designed to simultaneously provide better blocking capability against moisture or hydrogen diffusion and also increases the contact-to-floating gate distance, thereby reducing charge gain and charge loss.

SUMMARY OF THE INVENTION

One exemplary embodiment relates to an integrated circuit including a plurality of transistors. Each of the plurality of transistors include a gate stack and the plurality of transistors are at least partially covered by a capping layer and an interlevel dielectric. A hole extends through the capping layer and the interlevel dielectric. The configuration of the capping layer and the hole makes the integrated circuit less susceptible to charge gain or charge loss associated with the gate stacks.

Another exemplary embodiment relates to an integrated circuit including a first transistor and a second transistor having a first gate stack and a second gate stack, respectively. The integrated circuit further includes a capping layer disposed over the first gate stack, the second gate stack, and at least a first portion of the base layer between the first gate stack and the second gate stack. The integrated circuit still further includes an interlevel dielectric disposed over the capping layer, and a contact substantially disposed between the first and second gate stacks. The capping layer includes a buffer layer, a first insulative layer, and a second insulative layer.

A further exemplary embodiment relates to a method of manufacturing an integrated circuit. The method includes providing a gate stack on a base layer, providing a capping layer over the gate stack and the base layer, and providing an interlevel dielectric over the capping layer. The capping layer includes a buffer layer, a first insulative layer, and a second insulative layer. The method further includes etching the buffer layer, the first insulative layer, the second insulative layer, and the interlevel dielectric to form a hole extending to the base layer, wherein the hole includes at least one of a width wider at the interlevel dielectric than at the buffer layer and a step-like feature near the base layer.

BRIEF DESCRIPTION OF THE DRAWINGS

Exemplary embodiments will hereinafter be described with reference to the accompanying drawings, wherein like numerals denote like elements, and.

DETAILED DESCRIPTION OF PREFERRED EXEMPLARY EMBODIMENTS

FIGS. 1–6 illustrate an advantageous integrated circuit (IC) fabrication process. The process is capable of forming an integrated circuit that is not as susceptible to charge gain and charge loss in the floating gate of a flash memory. Alternatively, the process can be utilized to fabricate other types of ICs, including processors, logic circuit, dynamic random access memory, static random access memory, or other devices.

Figure 1:
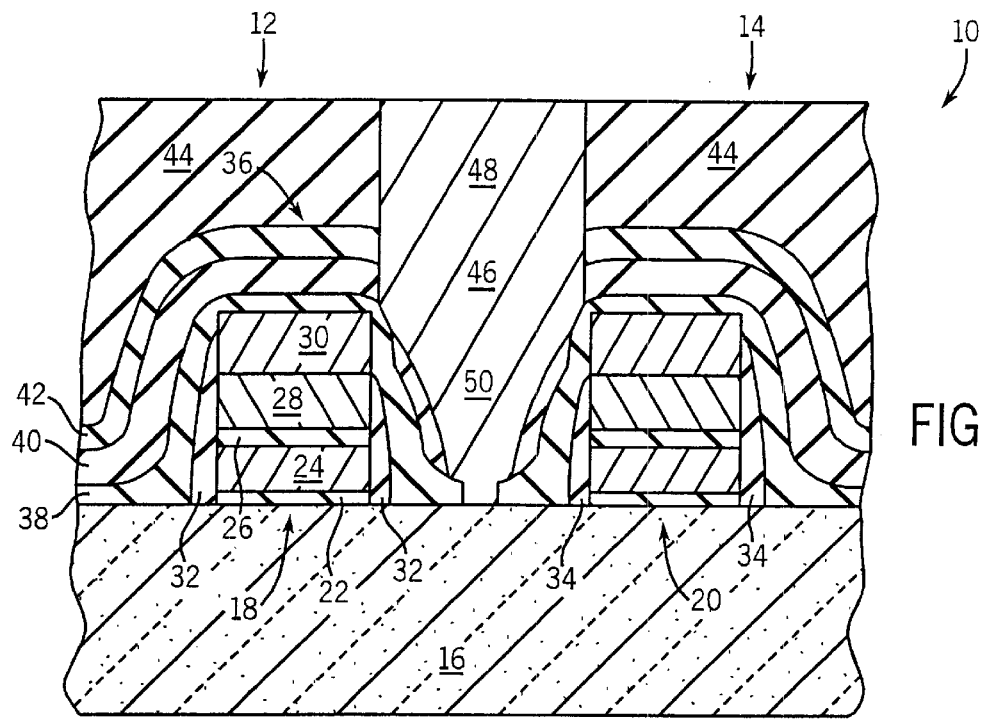
FIG. 1 is a cross-sectional view of a portion of an integrated circuit in accordance with an exemplary embodiment.

Referring to FIG. 1, a portion 10 of an integrated circuit can be any type of electrical device or part thereof. Preferably, portion 10 includes flash memory cells, such as adjacent flash memory cells 12, 14 shown in cross-section through a bit line. Flash memory cells 12, 14 are single transistor memory cells. Alternatively, flash memory cells 12, 14 may be other types of IC devices, transistors, or combinations thereof.

Flash memory cells 12, 14 are provided on a base layer or substrate 16. Substrate 16 is preferably a single crystal material such as a single crystal silicon wafer. Alternatively, substrate 16 can be a bulk substrate, an epitaxial layer, a gallium arsenide (GaAs) material, a silicon-on-insulator substrate, or other semi-conductive material.

Flash memory cell 12 includes a transistor that has a gate structure or stack 18. Flash memory cell 14 similarly includes a transistor that has a gate structure or stack 20. Flash memory cell 12 is substantially identical to flash memory cell 14. Accordingly, only the structure of flash memory cell 12 is discussed below.

Gate stack 18 of flash memory cell 12 includes a tunnel dielectric 22, a floating gate 24 (e.g., polysilicon one layer), a control gate dielectric 26, a control gate 28 (e.g., polysilicon two layer), and a silicide layer 30 (e.g., tungsten silicide, titanium silicide, or cobalt silicide). Gate stack 18 can also include a polysilicon cap layer. The width of gate stack 18 is between 0.25 to 0.5 microns, preferably 0.35 microns.

Silicide layer 30 is provided over control gate 28. Control gate 28 is provided over control gate dielectric 26. Control gate dielectric 26 is provided over floating gate 24. Floating gate 24 is provided over tunnel dielectric 22. Control gate 28 is preferably coupled to a word line through silicide layer 30.

Also provided on substrate 16 and proximate to flash memory cells 12, 14 are pairs of spacers 32, 34, a triple capping layer 36, an interlevel dielectric 44, and a contact 46. Each pair of spacers 32, 34 abuts the sides of gate stacks 18, 20, respectively. Spacers 32, 34 are preferably of an oxide material and are formed using a conventional etch-back process. Gate stacks 18, 20, spacers 32, 34, and substrate 16 are covered by the triple capping layer 36. Triple capping layer 36, to be described in greater detail hereinafter, is covered by the interlevel dielectric 44. Contact 46 is disposed substantially between gate stacks 18, 20. A bit line for flash memory cells 12, 14 can be coupled through interlevel dielectric 44 and triple capping layer 36 through contact 46.

Contact 46 includes a top portion 48, associated with the interlevel dielectric 44, and a bottom portion 50, associated with the triple capping layer 36. The shape of contact 46 is configured such that the width of contact 46 at bottom portion 50 is smaller than the width at top portion 48 by approximately 0.2 microns or less (e.g., 0.1 microns). Alternatively, when contact 46 is, for example, a self-aligned contact, the width difference between the top and bottom portions 48, 50 can be greater than 0.2 microns. Such a shape for contact 46 increases the distance (e.g., horizontally) between floating gate 24 and contact 46, thereby reducing horizontal charge gain and charge loss associated with flash memory cells 12, 14.

Figure 2:
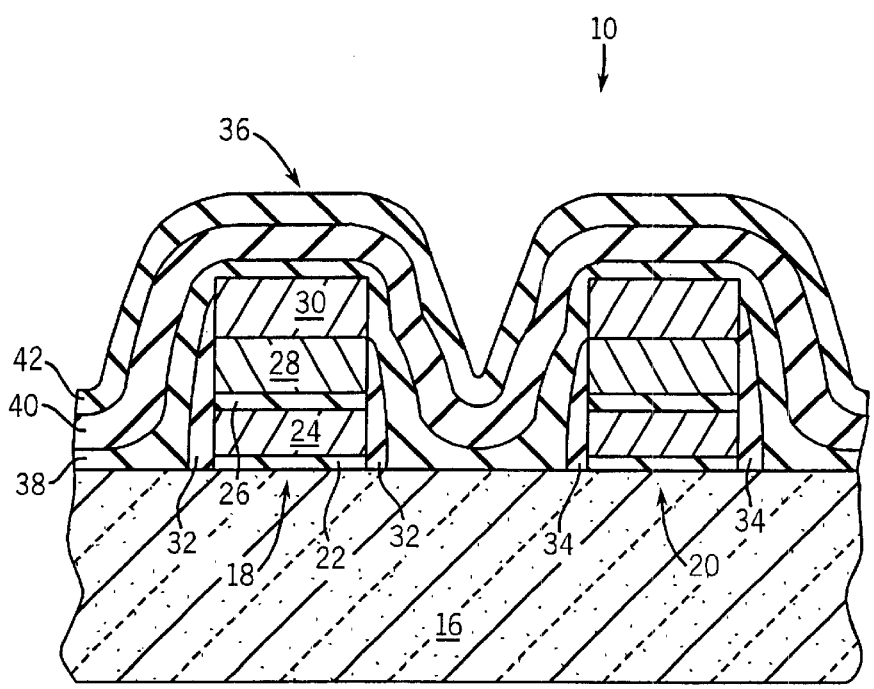
FIG. 2 is a cross-sectional view of the portion of the integrated circuit illustrated in FIG. 1, showing a triple capping layer deposition step.

Referring to FIGS. 2–6, the fabrication of portion 10 is described below. In FIG. 2, triple capping layer 36 is formed over gate stacks 18, 20, spacers 32, 34, and substrate 16. Triple capping layer 36 includes a buffer layer 38, a first insulative layer 40 and a second insulative layer 42. Second insulative layer 42 is provided over first insulative layer 40. First insulative layer 40 is provided over buffer layer 38.

Buffer layer 38, first insulative layer 40, and second insulative layer 42 are each deposited by a conventional process such as chemical vapor deposition (CVD). Buffer layer 38 is preferably an oxide material deposited by low pressure chemical vapor deposition (LPCVD) or plasma enhanced chemical vapor deposition (PECVD). Buffer layer 38 is deposited to a thickness of 100 to 500 Angstrom (Å), preferably 200 to 400 Å thick.

First insulative layer 40 is preferably a nitride material such as SiN and is deposited to a thickness of 100 to 2000 Å, preferably 600 to 1000 Å thick. The SiN comprising first insulative layer 40 is stoichiometric SiN. First insulative layer 40 may also be deposited by LPCVD or PECVD.

Second insulative layer 42 is preferably a highly ultra-violet transparent insulative layer such as silicon oxynitride (SiON) and is deposited to a thickness of 100 to 1000 Å, preferably 400 to 600 Å thick. Various formulas or chemical compositions of SiON for the second insulative layer 42 can be utilized. Second insulative layer 42 may also be deposited by a process using silane ($SiH_4$), nitrogen ($N_2$), and nitrogen dioxide ($NO_2$) as gas reactants, in which the nitrogen content is between 3% and 30%, preferably 10%. Various formulas or chemical compositions of SiN for the first insulative layer 40 can also be utilized.

In the course of the depositions, buffer layer 38, first insulative layer 40, and second insulative layer 42 will typically be deposited relatively thicker at corners associated with the interface of gate stacks 18, 20 and substrate 16 then at other portions of each of the layers 38, 40, 42. The shape of spacers 32, 34 also contributes to this effect of causing triple capping layer 36, particularly first insulative layer 40, to be thicker at the corners than at the flat portions between gate stacks 18, 20.

Triple capping layer 36 is at least thick as or preferably thicker than floating gate 24. Alternatively, second insulative layer 42 may be omitted from triple capping layer 36 as long as the first insulative layer 40 is thicker than described above so that the total thickness of the capping layer remains approximately the same.

Figure 3:
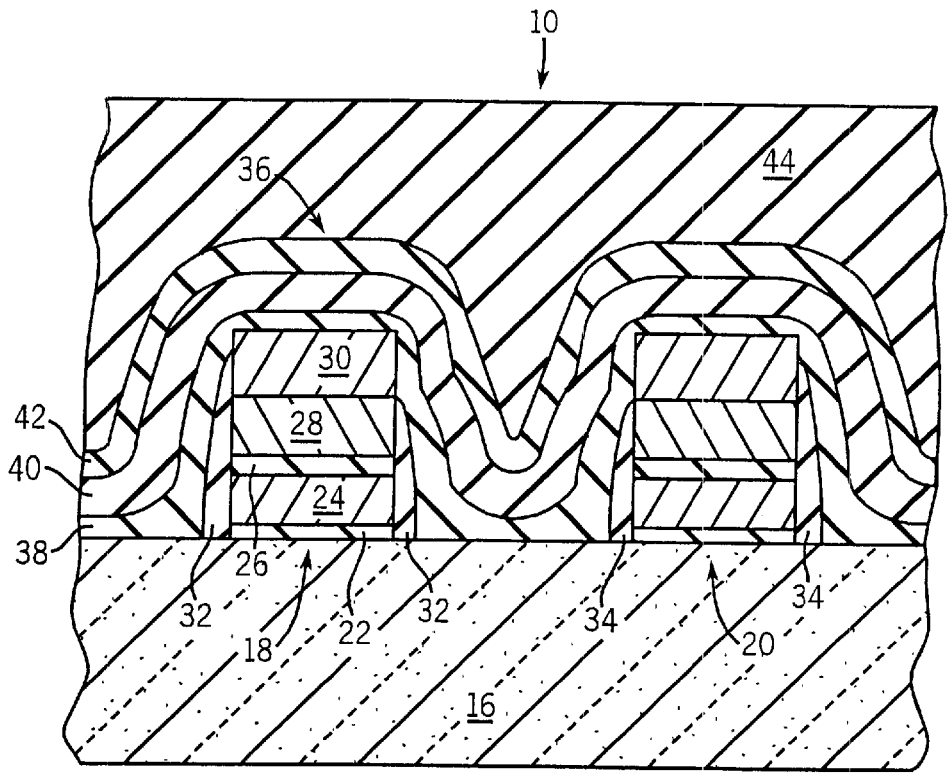
FIG. 3 is a cross-sectional view of the portion of the integrated circuit illustrated in FIG. 2, showing an interlevel dielectric deposition step.

In FIG. 3, interlevel dielectric 44 is deposited by a conventional process over triple capping layer 36. Interlevel dielectric 44 (also referred to as ILDO) can be silicon dioxide, boron phosphorus silicate glass (BPSG), or other insulative material. Alternatively, interlevel dielectric 44 may be a stack formation of combinations of silicon dioxide, BPSG, or other insulative layers. The deposition thickness of interlevel dielectric 44 is 1 to 2 micron.

Figure 4:
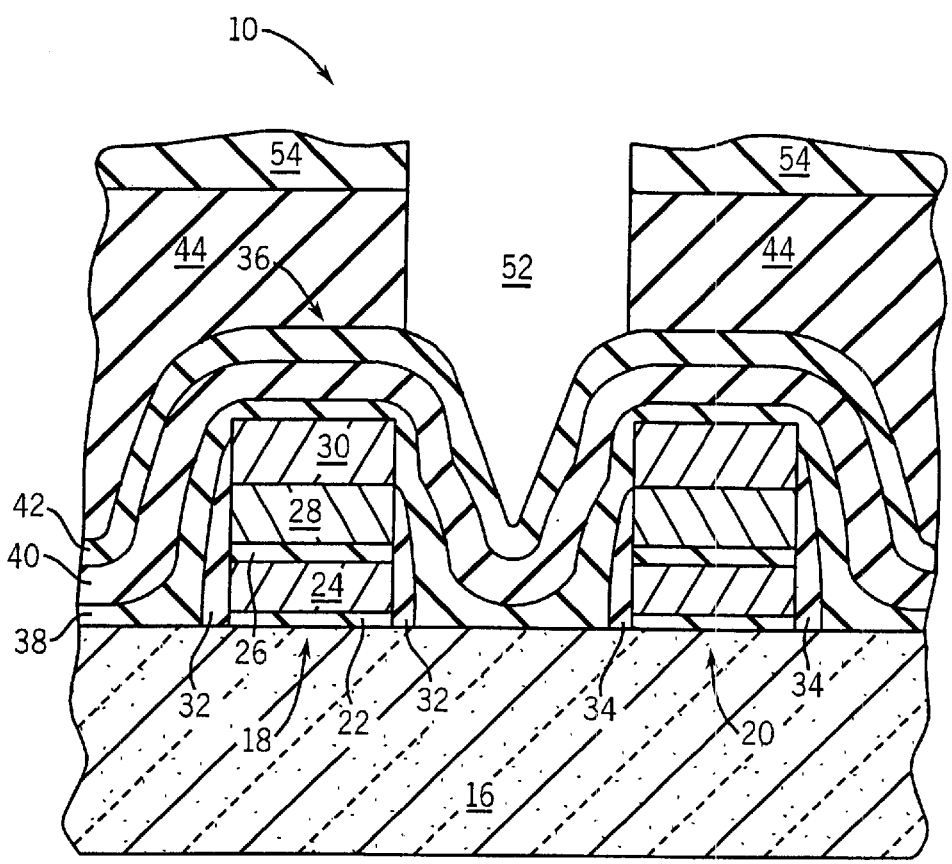
FIG. 4 is a cross-sectional view of the portion of the integrated circuit illustrated in FIG. 3, showing an interlevel dielectric etching step.

In FIG. 4, there is shown a mask and etch of interlevel dielectric 44 to form an aperture 52. Photoresist 54 patterned on interlevel dielectric 44 defines the width of aperture 52. The difference in etch characteristics between interlevel dielectric 44 and triple capping layer 36 defines the depth or bottom of aperture 52. A first etch chemistry utilized to etch interlevel dielectric 44 is selected to take advantage of the difference in etch selectivity of interlevel dielectric 44 and triple capping layer 36 (particularly the first and second insulative layers 42, 40). Preferably, first etch chemistry is selected such that only a negligible amount or none of the triple capping layer 36 will be etched during this etch process. For example, interlevel dielectric 44 can be etched in accordance with a dry-etching process to form aperture 52. First etch chemistry includes a conventional $C_4F_8$, CO, and Ar chemistry so that interlevel dielectric 44 can be etched effectively as well as the etch process substantially stopping when it reaches the second insulative layer 42, which is comprised of a material such as SiON.

Figure 5:
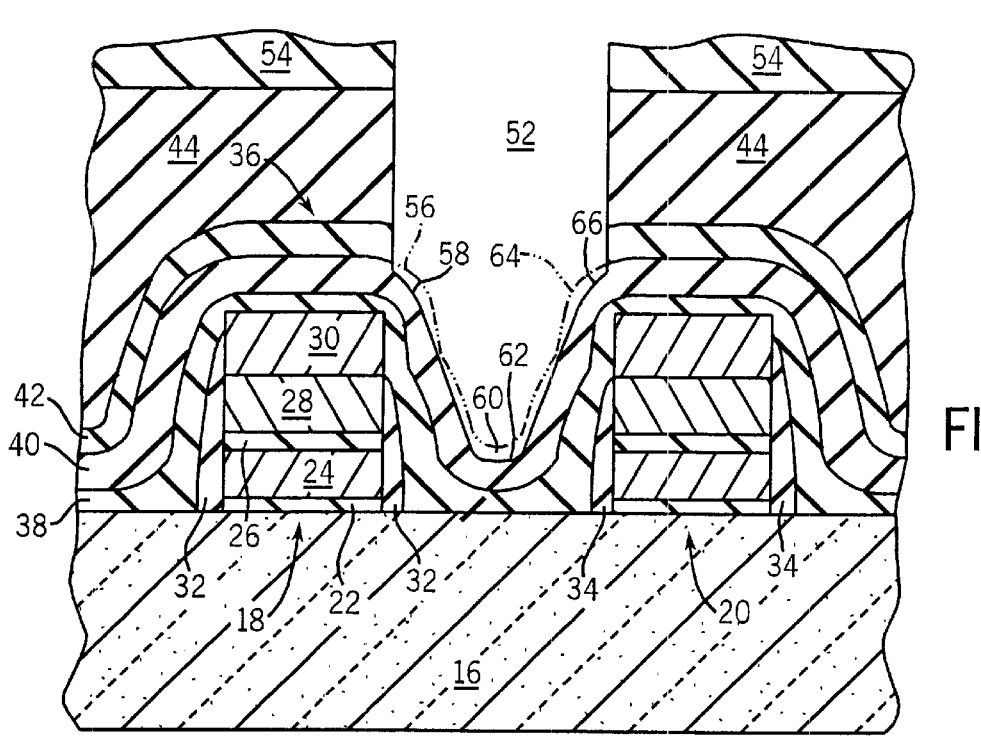
FIG. 5 is a cross-sectional view of the portion of the integrated circuit illustrated in FIG. 4, showing an etching step of a second insulative layer of the triple capping layer.

In FIG. 5, a second etch chemistry is applied to portion 10 to control etch the second insulative layer 42 and the first insulative layer 40 in aperture 52. Preferably the second etch chemistry includes $CH_3F$ and $O_2$ chemistry. Since the etch selectivity of the first and second insulative layers 42, 40 are quite similar to each other, second insulative layer 42 will be etched and the first insulative layer 40 will be partially etched. Specifically, second insulative layer 42 and at least top corners 56, 64 and a bottom portion 60 of first insulative layer 40 will be etched away such that an etch profile after the second insulative layer etching step includes rounded corners 58, 66 and a thinned bottom 62 of the first insulative layer 40. Moreover, the second etch chemistry assists in giving bottom portion 50 of contact 46 (see FIG. 1) a tapered (top wider than bottom) form through the first insulative layer 40.

Figure 6:
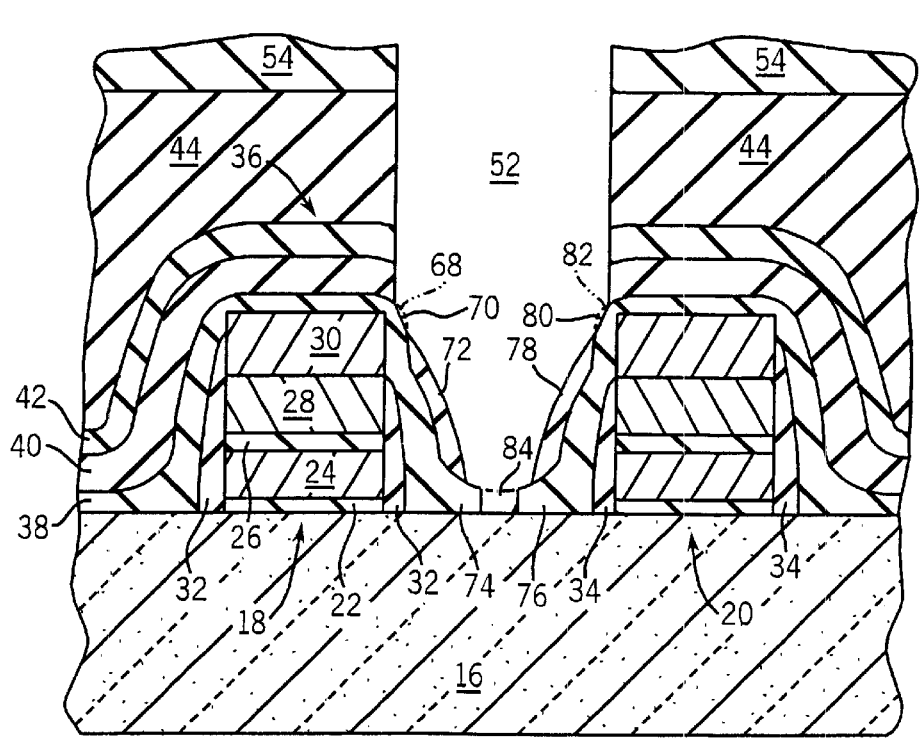
FIG. 6 is a cross-sectional view of the portion of the integrated circuit illustrated in FIG. 5, showing an etching step of a first insulative layer of the triple capping layer.

In FIG. 6, a third etch chemistry is applied to portion 10 to provide a final control etch of first insulative layer 40 in aperture 52. Preferably the third etch chemistry includes $CH_3F$ and $O_2$ chemistry. The first insulative layer etching step results in a partial etch of first insulative layer 40 and buffer layer 38. In detail, the top corners, the bottom, and a portion of the sides of first insulative layer 40 are etched away such that thinned sides 72, 78 of first insulative layer 40 remain. Top corners 68, 82 and a bottom portion 84 of buffer layer 38 are similarly etched away such that the bottom of aperture 52 extends to substrate 16 and step-like features 74, 76 result. Thus, an etch profile after the first insulative layer etching step includes corners 70, 80; thinned sides 72, 78; and step-like features 74, 76.

It should be understood that the interlevel dielectric etching, the second insulative layer etching, and the first insulative layer etching can sequentially occur in the same fabrication chamber without having to open the chamber therein between. Alternatively, each etching step can take place in its own chamber with separate fabrication machinery.

The second and third etch chemistries in combination with the materials comprising the triple capping layer 36 are utilized to tailor the width of bottom portion 50 of contact 46 (FIG. 1). These controlled etch processes provide a more controllable contact-to-floating gate distance. For example, step-like feature 74 provides a greater horizontal distance from contact 46 to floating gate 24 of gate stack 18, thereby providing less susceptibility (i.e., high resistance) to charge gains and losses for flash memory cell 18. Similarly, step-like feature 76 provides a greater horizontal distance from contact 46 to the floating gate of gate stack 20, thereby providing less susceptibility to charge gains and losses for flash memory cell 20.

Although aperture 52 (FIG. 6) for contact 46 (FIG. 1) is preferably shown to have vertical sides on its top portion and slanted sides on its bottom portion, the top portion may be slanted and the bottom portion may be vertical by etching interlevel dielectric 44 and triple capping layer 36 accordingly.

Referring to FIG. 1, after aperture 52 is etched and substrate 16 is reached, a conformal layer of a conductive material is deposited over triple capping layer 36 and substantially fills aperture 52. The conformal layer is etched or removed to leave contact 46 in aperture 52. Preferably, the conformal layer includes tungsten and is subject to a chemical mechanical polish (CMP) until interlevel dielectric 44 is reached. The interlevel dielectric 44 thickness after CMP is 0.6 to 1.2 micron, preferably 0.9 micron. Alternatively, other conductive materials for contact 46 can be utilized. For example, contact 46 can include a titanium or cobalt silicide portion to decrease series resistance. Moreover, it is preferable that contact 46 be a self-aligned contact because this facilitates, among other, easier contact patterning, larger contact size, and the use of a R-line stepper for lithography instead of the much more expensive deep ultraviolet (UV) stepper. Alternatively, although not shown, contact 46 need not be a self-aligned contact; instead, aperture 52 may be etched to have a width smaller than the distance between gate stacks 18, 20 and be positioned completely in between gate stacks 18, 20.

Thus, triple capping layer 36 provides blocking capability against moisture or hydrogen diffusion for gate stacks 18, 20 and also increases the horizontal contact-to-floating gate distances in flash memory cells 12, 14, respectively. In this manner, each of the functions of triple capping layer 36 facilitates minimization of the charge gain and loss problem.

It is understood that, while preferred exemplary embodiments, examples, materials, and values are given, they are for the purpose of illustration only. The apparatus and method of the invention are not limited to the precise details and conditions disclosed. For example, first insulative layer 40 may have a smaller thickness than discussed above as long as it would not cause an electrical short to occur at corners 70, 80. In another example, although silicon oxynitride and silicon nitride materials are mentioned, other materials having similar etch characteristics can be utilized. Thus, changes may be made to the details disclosed without departing from the spirit of the invention, which is defined by the following claims.

What is claimed is:

1. An integrated circuit including a plurality of transistors, each of the transistors having a gate stack including a floating gate, the transistors being at least partially covered by a triple layered capping layer and an interlevel dielectric, wherein the triple layered capping layer includes a bottom buffer layer, a middle insulative layer, and a highly transparent layer, wherein a contact extends through the capping layer and the interlevel dielectric between adjacent gate stacks of the plurality of transistors and the configuration of the triple layered capping layer and the contact makes the integrated circuit resistant to charge gain or charge loss associated with the gate stacks, wherein only the bottom buffer layer extends continuously from a level below a top surface of the floating gate conductor to a top surface of the gate stack in a cross-sectional view through the contact and the first gate stack.

2. The integrated circuit of claim 1, wherein the triple layered capping layer includes multiple layers, at least one of the multiple layers terminates at a side wall of the contact at a level above a top surface of the gate stack.

3. The integrated circuit of claim 2, wherein the triple layered capping layer includes silicon oxynitride.

4. The integrated circuit of claim 3, wherein the highly transparent layer includes SiON.

5. The integrated circuit of claim 3, wherein the highly transparent layer is a top layer.

6. The integrated circuit of claim 3, wherein the highly transparent layer is approximately 100 to 1000 Å thick.

7. The integrated circuit of claim 3, wherein the middle insulative layer is approximately 100 to 2000 Å thick.

8. The integrated circuit of claim 3, wherein the buffer layer includes an oxide material and is approximately 100 to 500 Å thick.

9. The integrated circuit of claim 1, wherein the contact includes a bottom width smaller than its top width.

10. The integrated circuit of claim 1, wherein the floating gate is polysilicon.

11. An integrated circuit, comprising:
a first transistor having a first gate stack disposed on a base layer;
a second transistor having a second gate stack disposed on the base layer, wherein the first and second gate stack each include a floating gate conductor having a first thickness;
a triple layered capping layer disposed over the first gate stack and the second gate stack, wherein the triple layered capping layer includes a buffer layer, a first insulative layer, and a second insulative layer, at least one layer of the triple layered capping layer extending over a first portion of the base layer between the first gate stack and the second gate stack;
an interlevel dielectric disposed over the capping layer; and
a contact substantially disposed between the first gate stack and the second gate stack, the contact extending through the interlevel dielectric and the capping layer to be electrically connected to a second portion of the base layer, wherein the contact has a bottom width through the capping layer smaller than a top width through the interlevel dielectric, wherein the first insulative layer and the second insulative layer terminate on a side wall of the contact at a level above the first gate stack.

12. The integrated circuit of claim 11, wherein at least one of the first and second gate stack has a floating gate and wherein the thickness of the capping layer is at least equal to the thickness of the floating gate.

13. The integrated circuit of claim 11, wherein the second insulative layer is disposed over the first insulative layer, the first insulative layer is disposed over the buffer layer, and the buffer layer is disposed over the first gate stack, the second gate stack and the first portion of the base layer wherein at a location between the first gate stack and the contact, the buffer layer is L-shaped having a first end and a second end, the first end and the second end contacting the contact.

14. The integrated circuit of claim 13, wherein a portion of the first insulative layer is disposed between the first end and the second end and the second insulative layer is absent from between the first end and the second end.

15. The integrated circuit of claim 11, wherein the first insulative layer includes SiN and is approximately 100 to 2000 Å thick.

16. The integrated circuit of claim 11, wherein the buffer layer includes an oxide material and is approximately 100 to 500 Å thick.

17. The integrated circuit of claim 11, wherein the bottom width is smaller than the top width by approximately 0.2 microns.

18. A method of manufacturing an integrated circuit, comprising:
providing a gate stack on a base layer, the gate stack includes a floating gate conductor having a first thickness;
providing a triple layered capping layer having a second thickness greater than the first thickness, the layered capping layer being provided over the gate stack and the base layer, wherein the layered capping layer includes a buffer layer, a first insulative layer, and a second insulative layer;
providing an interlevel dielectric over the capping layer; and
etching the buffer layer, the first insulative layer, the second insulative layer, and the interlevel dielectric to form a hole extending to the base layer, wherein the hole includes at least one of a width wider at the interlevel dielectric than at the buffer layer and a step-like feature near the base layer, wherein the first insulative layer and the second insulative terminate at a side wall of the contact and the buffer layer extends from a top surface of the base layer to a level above a top surface of the gate stack along the side wall of the contact.

19. The method of claim 18, wherein at least one of the first and second insulative layer has a different etch selectivity than the interlevel dielectric.

20. The method of claim 18, wherein the etching step includes a first etching step to etch the interlevel dielectric, a second etching step to etch the second insulative layer, and a third etching step to etch the first insulative layer.

21. The method of claim 20, wherein the first etching step includes a first etchants of Ar, CO, and $C_4F_8$, the second etching step includes a second etchants of $CH_3F$ and $O_2$, and the third etching step includes a third etchants of $CH_3F$ and $O_2$.

22. The method of claim 18, wherein providing the capping layer includes providing the buffer layer over the gate stack and the base layer, providing the first insulative layer over the buffer layer, and providing the second insulative layer over the first insulative layer.

* * * * *